(12) United States Patent
Stephan et al.

(10) Patent No.: US 8,796,807 B2
(45) Date of Patent: Aug. 5, 2014

(54) TEMPERATURE MONITORING IN A SEMICONDUCTOR DEVICE BY USING A PN JUNCTION BASED ON SILICON/GERMANIUM MATERIALS

(75) Inventors: Rolf Stephan, Dresden (DE); Markus Forsberg, Dresden (DE); Gert Burbach, Dresden (DE); Anthony Mowry, Buda, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/251,532

(22) Filed: Oct. 3, 2011

(65) Prior Publication Data

US 2012/0025276 A1 Feb. 2, 2012

Related U.S. Application Data

(62) Division of application No. 12/204,022, filed on Sep. 4, 2008, now abandoned.

(30) Foreign Application Priority Data

Feb. 29, 2008 (DE) .................. 10 2008 011 816

(51) Int. Cl.
*H01L 31/058* (2006.01)
(52) U.S. Cl.
USPC ............. 257/470; 257/48; 257/467; 257/616; 257/E27.016; 257/E27.024; 374/100; 374/163
(58) Field of Classification Search
CPC ................ H01L 27/0629; H01L 27/1203

USPC ............... 257/467, 470, 48, 616, E27.016, 257/E27.024; 374/100, 163
See application file for complete search history.

(56) References Cited

U.S. PATENT DOCUMENTS

| | | | |
|---|---|---|---|
| 6,230,497 B1 | 5/2001 | Morris et al. | ..... 62/3.7 |
| 7,075,165 B2 * | 7/2006 | Leon et al. | ..... 257/458 |
| 2005/0093021 A1 | 5/2005 | Ouyang et al. | ..... 257/194 |

FOREIGN PATENT DOCUMENTS

| | | | |
|---|---|---|---|
| DE | 1 808 661 | 6/1969 | |
| DE | 102006002904 A1 | 8/2007 | ..... H01L 23/58 |
| GB | 2 261 321 A | 5/1993 | ..... H01L 27/07 |

OTHER PUBLICATIONS

Translation of Official Communication from German Patent Office for German Patent Application No. 10 2008 011 816.8 dated Nov. 21, 2008.

\* cited by examiner

*Primary Examiner* — Jay C Kim

(57) ABSTRACT

By incorporating germanium material into thermal sensing diode structures, the sensitivity thereof may be significantly increased. In some illustrative embodiments, the process for incorporating the germanium material may be performed with high compatibility with a process flow for incorporating a silicon/germanium material into P-channel transistors of sophisticated semiconductor devices. Hence, temperature control efficiency may be increased with reduced die area consumption.

6 Claims, 5 Drawing Sheets

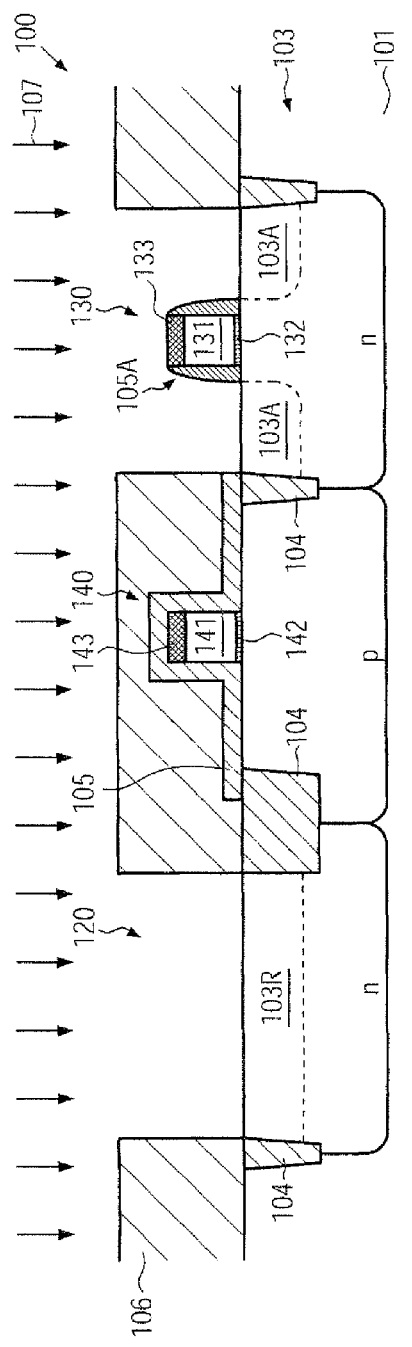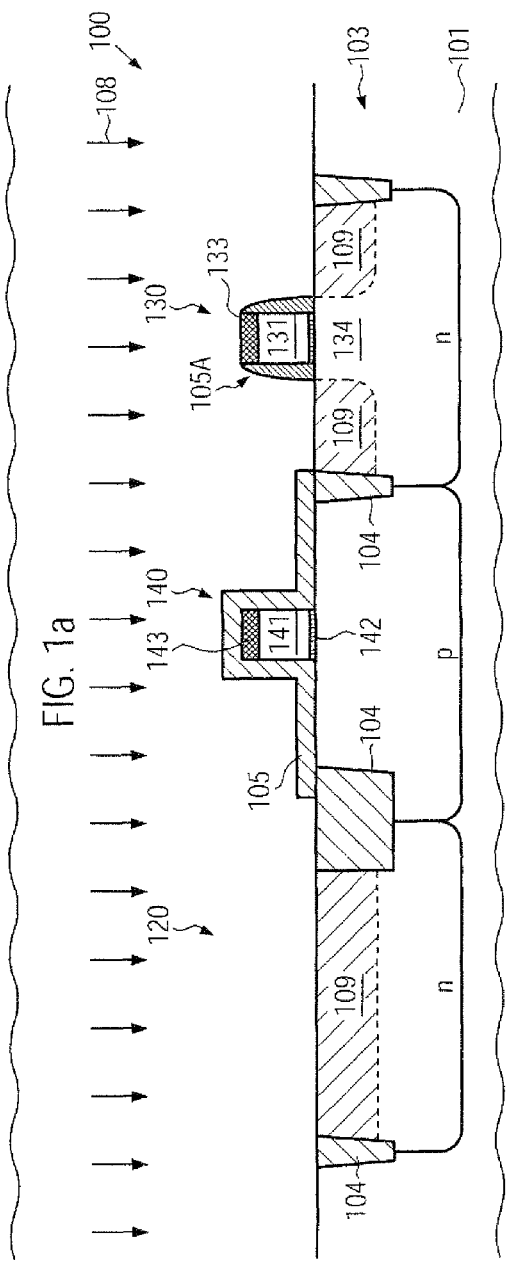

TEMPERATURE MONITORING IN A SEMICONDUCTOR DEVICE BY USING A PN JUNCTION BASED ON SILICON/GERMANIUM MATERIALS

CROSS-REFERENCE TO RELATED APPLICATION

This is a divisional of application Ser. No. 12/204,022, filed Sep. 4, 2008 now abandoned.

BACKGROUND

1. Field of the Disclosure

Generally, the present disclosure relates to the formation of integrated circuits, and, more particularly, to thermal sensing techniques in semiconductor devices on the basis of diode structures.

2. Description of the Related Art

The fabrication of integrated circuits requires a large number of circuit elements, such as transistors and the like, to be formed on a given chip area according to a specified circuit layout. Generally, a plurality of process technologies are currently practiced, wherein, for complex circuitry, such as microprocessors, storage chips, ASICs (application specific ICs) and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors, thereby resulting in a demand for reducing the channel length of transistors.

The increased packing density of integrated circuits resulting from the reduced device dimensions has given rise to the incorporation of more and more functions into a single semiconductor die. Furthermore, the reduced feature sizes may also be accompanied by reduced switching speeds of the individual transistors, thereby contributing to increased power consumption in MOS circuits, since the reduced switching speeds allow the operation of the transistors at higher switching frequencies, which in turn increases the power consumption of the entire device. In sophisticated applications using densely packed integrated circuits, the heat generation may reach extremely high values due to the dynamic losses caused by the high operating frequency, in combination with a significant static power consumption of highly scaled transistor devices, owing to increased leakage currents that may stem from extremely thin gate dielectrics, short channel effects and the like. Therefore, great efforts are being made in order to reduce overall power consumption by restricting the usage of high performance transistors, which usually cause higher heat generation, to performance-critical signal paths in the circuit design, while using less critical devices in other circuit areas. Moreover, appropriate mechanisms may be implemented to operate certain circuit portions "on demand" and control local or global operating conditions depending on the thermal situation in the semiconductor die. Since external heat management systems may not enable a reliable estimation of the die-internal temperature distribution due to the delayed thermal response of the package of the semiconductor device and the possibly insufficient spatial temperature resolution, these external concepts may have to be designed so as to take into consideration these restrictions and provide sufficient operational margins with respect to heat control, or to risk otherwise overheating and thus possibly destruction of specific critical circuit portions.

Manufacturers of semiconductor products therefore increasingly prefer accurate internal temperature measurements that substantially do not depend on external device conditions and dedicated thermal hardware components that may be subject to external tampering, while also avoiding the slow thermal response via the device package. For this purpose, sophisticated heat monitoring regimes may typically be incorporated into the overall design of the integrated circuit, which may enable a device-internal heat management, irrespective of external conditions. Thus, die-internal temperature measurements are typically performed in complex devices, such as CPUs, ASICs and the like, so as to provide device-internal data for controlling the overall operation by adjusting operating frequency, switching off respective circuit portions and the like. A respective die-internal heat management system therefore relies on accurate temperature measurement. In many approaches for measuring the die-internal temperature or temperature gradients, this is accomplished by positioning temperature-sensitive circuits around the die in order to locally determine the temperature. The various temperature measurements may then be combined to provide a global measure of the die temperature, while also allowing local assessment of the thermal conditions across the die, depending on the distribution of the temperature-sensitive circuits. Hence, the higher a spatial resolution of the measured temperature profile is desired, the more temperature sensing locations and hence respective sensor circuits are required.

The incorporation of a plurality of temperature-sensitive circuits, however, may result in a significant "consumption" of valuable real estate of the semiconductor die, which may typically cause a "competitive" situation during circuit design between actual circuit portions and temperature-sensitive areas. Therefore, frequently, the temperature-sensitive circuit portions are treated with reduced priority compared to the "actual" circuit portions, which may finally result in a circuit design in which the temperature-sensitive circuits are positioned in less than ideal temperature sensing locations. For instance, the design of performance-critical circuit portions of the device that may be operated at higher speed or frequencies may not be compatible with the provision of sensor elements in these critical areas, for example, due to undesired lengthening of the signal routing and reduction of speed. Hence, although these performance-critical areas usually generate a significantly higher amount of heat, the temperature of such "hot spots" may not be reliably measured, since the temperature-sensitive circuits are positioned by the design constraints at distant locations. Therefore, in this case, damage of the performance-critical areas may occur or respective heat management strategies may be required to take into account the discrepancy of the measurement data and the actual thermal conditions in the performance-critical areas.

Similarly, the thermal response of the temperature-sensitive circuits may be affected by the shielding effect of materials and structures that may be provided in the vicinity of the temperature-sensitive circuits. For example, due to the reduced heat dissipation capability of semiconductor-on-insulator (SOI) devices caused by the buried insulating layer, on which the actual "active" device layer is formed, the corresponding sensing of the momentary temperature in SOI devices is of particular importance, wherein, additionally, the design-dependent positioning of the temperature sensitive circuits may further contribute to a less efficient overall temperature management in sophisticated SOI devices.

Frequently, for thermal sensing applications, an appropriate silicon diode structure may be used wherein the corresponding characteristic of the silicon diode may permit information to be obtained on the thermal conditions in the vicinity of the diode structure. The sensitivity and the accuracy of the respective measurement data obtained on the basis of the diode structure may significantly depend on the diode characteristic, i.e., on the diode's current/voltage characteristic, which may depend on temperature and other parameters. For thermal sensing applications, it may, therefore, typically be desirable to provide a substantially "ideal" diode characteristic in order to provide the potential for precisely estimating the temperature conditions within the semiconductor device. In SOI devices, a corresponding diode structure, i.e., the respective PN junction, may be formed in the substrate material located below the buried insulating layer, above which is formed the "active" semiconductor layer used for forming therein the transistor elements. Thus, in addition to the shielding effect of the buried insulating layer, at least some additional process steps may be required, for instance, for etching through the semiconductor layer or a corresponding trench isolation area and through the buried insulating layer in order to expose the crystalline substrate material, thereby contributing to the overall process complexity. Otherwise, the diode structure may be formed in the active device layer of the SOI device, similarly as in a bulk configuration. In any case, the silicon diode structure for thermal sensing applications typically requires increased silicon area in order to provide an appropriate temperature signal that may be evaluated for efficient temperature control of the device. Furthermore, the temperature-sensing diodes, in combination with an appropriate evaluation circuit, may also be subject to similar design constraints as described above, irrespective of whether a bulk architecture or an SOI architecture is considered. Hence, currently employed die-internal temperature monitoring mechanisms, although providing significant advantages over external temperature management systems, may suffer from increased die area consumption due to low temperature sensitivity, possibly in combination with reduced proximity to hot spots, which may result in reduced reliability of the die-internal temperature control.

The present disclosure is directed to various methods and devices that may avoid, or at least reduce, the effects of one or more of the problems identified above.

SUMMARY OF THE DISCLOSURE

The following presents a simplified summary of the disclosure in order to provide a basic understanding of some aspects disclosed herein. This summary is not an exhaustive overview, and it is not intended to identify key or critical elements of the invention or to delineate the scope of the invention. Its sole purpose is to present some concepts in a simplified form as a prelude to the more detailed description that is discussed later.

Generally, the subject matter disclosed herein relates to semiconductor devices and methods providing enhanced temperature sensing capabilities in semiconductor devices while reducing area consumption and/or providing higher efficiency for evaluating temperatures, for instance, of critical device regions, by enhancing the temperature sensitivity of thermal sensing diode structures. For this purpose, the present disclosure contemplates the usage of a semiconductor material having a reduced band gap energy compared to silicon, which therefore may result in an increased temperature sensitivity of a diode structure having a PN junction including the material of reduced band gap energy. In illustrative aspects disclosed herein, a germanium material may be incorporated into the diode structure for silicon-based semiconductor devices, thereby providing the enhanced temperature sensitivity which may therefore result in less area consumption of diode structures used for thermal sensing applications compared to conventional silicon diode structures. In some illustrative aspects disclosed herein, the incorporation of germanium material, for instance in the form of a silicon/germanium alloy material, may be accomplished with a high degree of compatibility with process techniques used for forming transistor elements in the device layer of SOI devices or bulk devices and also within the crystalline silicon substrate of SOI devices when germanium material may be used for performance enhancement of transistor elements, such as P-channel transistors, as may typically be the case for sophisticated semiconductor devices. Consequently, temperature sensitivity of the thermal sensing diode structures may be enhanced, thereby resulting in reduced area consumption, while substantially avoiding additional process complexity when using germanium material for providing strain-inducing mechanisms in at least one type of transistor element. Thus, an increased degree of coverage of areas of interest within a die region may be accomplished, since the thermal sensing diodes of reduced size may provide enhanced flexibility with respect to design constraints for critical device areas, as previously explained. For this reason, overall die-internal temperature control may be enhanced, thereby increasing the overall reliability of advanced semiconductor devices.

One illustrative semiconductor device disclosed herein comprises a silicon-containing semiconductor layer that is formed above a substrate. The semiconductor device further comprises a transistor formed in and above the silicon-containing semiconductor layer and a thermal sensing diode that is formed in the silicon-containing semiconductor layer. The thermal sensing diode comprises a P-doped region and an N-doped region, at least one of which comprises a germanium material.

A further illustrative semiconductor device disclosed herein comprises a silicon-containing semiconductor layer formed above a crystalline silicon-containing substrate. The semiconductor device further comprises a buried insulating layer located between the silicon-containing semiconductor layer and the substrate. Additionally, the semiconductor device comprises a thermal sensing diode formed in the crystalline silicon-containing substrate, wherein the thermal sensing diode comprises a P-doped region and an N-doped region, at least one of which comprises germanium.

One illustrative method disclosed herein comprises forming one or more recesses in a silicon-containing crystalline semiconductor material and selectively growing a silicon/germanium alloy material in the one or more recesses. Additionally, the method comprises forming at least one of a P-doped region and an N-doped region in the silicon/germanium alloy material, wherein the P-doped region and/or the N-doped region form a PN junction of a diode structure. Finally, the method comprises using a signal obtained from the diode structure for estimating a temperature of the diode structure.

BRIEF DESCRIPTION OF THE DRAWINGS

The disclosure may be understood by reference to the following description taken in conjunction with the accompanying drawings, in which like reference numerals identify like elements, and in which:

FIGS. 1a-1c schematically illustrate cross-sectional views of the semiconductor device during various manufacturing stages in forming a thermal sensing diode structure and respective transistor elements in a bulk configuration, according to illustrative embodiments;

Figure 1C:
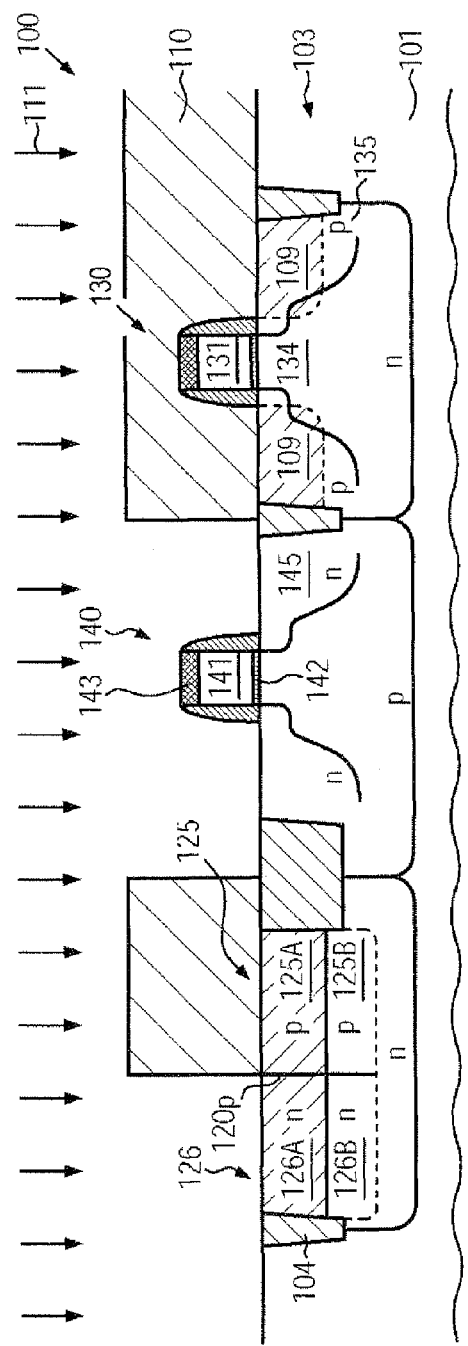

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein contemplates enhanced techniques for monitoring the temperature distribution in a semiconductor die by providing temperature-sensitive diode structures with enhanced temperature sensitivity and/or reduced area consumption. The enhanced temperature sensitivity may provide increased signal strength, thereby also contributing to increased temperature control reliability in sophisticated applications. In illustrative aspects disclosed herein, the temperature sensitivity of the diode structures for thermal sensing applications may be enhanced by incorporating germanium material, which has a reduced band gap compared to silicon, which may result in increased rate of change of the diode current versus the diode temperature. The germanium material may be incorporated on the basis of any appropriate manufacturing technique which is well established in the art, since germanium material may frequently be used in combination with advanced semiconductor devices to increase charge carrier mobility by appropriately positioning a silicon/germanium material on or in the vicinity of the channel region in order to modify the lattice structure therein. For example, in advanced CMOS techniques, performance of P-channel transistors may be enhanced by providing a strained silicon/germanium alloy material in the drain and source areas, which may thus result in an increased hole mobility, which may directly translate into an enhanced drive current capability. The silicon/germanium material may be efficiently provided on the basis of selective epitaxial growth techniques, wherein the silicon/germanium material may be grown in previously formed cavities, which may thus be refilled to any appropriate height level, wherein the silicon/germanium material may also be provided in the diode structures, thereby substantially avoiding any additional manufacturing steps compared to conventional strategies. In other cases, the germanium material may be incorporated into the thermal sensing diode structures at any appropriate manufacturing stage on the basis of separate process steps, depending on the overall desired diode characteristics.

FIG. 1a schematically illustrates a cross-sectional view of a semiconductor device 100 comprising a substrate 101 above which may be formed a silicon-containing semiconductor layer 103. In the embodiment shown, the semiconductor device 100 may represent a "bulk" configuration, which is to be understood as a device architecture in which the semiconductor layer 103 may have a thickness such that any circuit elements or portions thereof formed in the layer 103 may be formed on an underlying silicon-containing crystalline material, which may thus electrically interconnect the various circuit elements. For example, the thickness of the semiconductor layer 103 may be greater than a maximum depth of isolation structures 104, which may be provided for separating respective device regions, such as transistor active regions and the like. For example, the semiconductor layer 103 may represent an upper portion of the substrate 101, which may be provided in the form of a substantially crystalline silicon-containing semiconductor material. The semiconductor device 100 may comprise a region 120 corresponding to an area in which a diode structure for thermal sensing applications is to be formed in and above the layer 103. Furthermore, the semiconductor device 100 may comprise a plurality of "regular" circuit elements, which may be represented in the embodiment shown by a first transistor 130 and a second transistor 140. One or both of the transistors 130, 140 may be a part of a circuit, for instance, a support circuitry for the thermal sensing diode structure still to be formed in the region 120, or one or both of the transistors 130, 140 may represent circuit elements for functional logic blocks, memory areas and the like as may be required for the base circuit function of the device 100. For example, the transistors 130, 140 may be a part of a critical signal path which may be operated at higher frequency so that significant heat may be generated and may have to be dissipated. In this case, the region 120 may be positioned near the transistors 130, 140, thereby providing a signal that is highly correlated with the thermal status of these circuit elements. In one illustrative embodiment, it may be assumed that the first transistor 130 may receive a semiconductor alloy, such as a silicon/germanium material, in order to enhance performance thereof, for instance by creating a respective strain, as previously explained. In other illustrative embodiments (not shown), the first and second transistors 130, 140 may be formed on the basis of the material of the layer 103 without introducing a material for reducing the band gap energy, such as germanium, or creating strain on the basis of relaxed or strained semiconductor compounds.

The transistors 130, 140 may comprise, in the manufacturing stage shown, gate electrodes 131, 141 comprised of any appropriate material, such as polysilicon and the like, which may be separated from the material of the semiconductor layer 103 by gate insulation layers 132, 142, respectively. The gate insulation layers 132, 142 may be comprised of any appropriate material, such as silicon dioxide, nitrogen-containing silicon dioxide, high-k dielectric materials and the like. The area of the semiconductor layer 103 corresponding to the transistor 140 may be covered by a mask layer 105, which may, for instance, be comprised of silicon nitride and the like, while the area of the layer 103 corresponding to the first transistor 130 may be substantially exposed, wherein only the gate electrode 131 is encapsulated by a spacer structure 105A and a cap layer 133. For example, the spacer structure 105A and the cap layer 133 may be comprised of any appropriate material, such as silicon nitride and the like. Furthermore, in the manufacturing stage shown, an etch mask 106 may be provided so as to expose the first transistor 130 and the region 120.

The semiconductor device 100 as shown in FIG. 1a may be formed on the basis of the following processes. Prior to or after forming the isolation structures 104, the basic dopant profile may be defined in the semiconductor layer 103, which may be accomplished by well-established implantation processes. For example, active areas may be defined for the transistors 130, 140, wherein it may be assumed that the transistor 130 may represent a P-channel transistor, thereby requiring N-doping. On the other hand, the transistor 140, when representing an N-channel transistor, may receive a basic P-doping, while the region 120 may be pre-doped in any appropriate manner as may be required for the operation of the thermal sensing diode structures still to be formed. In the embodiment shown, it may be assumed that a basic N-doping may be created in the region 120. The various basic dopant profiles may be created on the basis of appropriate masking regimes and appropriately selected implantation parameters. The isolation structures 104 may be formed by advanced lithography, etch, deposition and planarization techniques in accordance with well-established process strategies. Thereafter, appropriate materials for the gate insulation layers 132, 142 may be formed, for instance, by oxidation and/or deposition, followed by the deposition of an appropriate material for the gate electrodes 131, 141, which may then be patterned by using sophisticated lithography and etch techniques, wherein also the cap layer 133 and a corresponding cap layer 143 in the transistor 140 may be defined. Next, the mask layer 105 may be deposited, for instance, by plasma-enhanced chemical vapor deposition, thermally-activated chemical vapor deposition and the like, thereby depositing an appropriate material, such as silicon nitride and the like. Thereafter, the resist mask 106 may be formed wherein, contrary to conventional strategies in which a silicon-based diode structure may be provided, the region 120 may be exposed by the mask 106 so as to prepare the region 120 for the epitaxial growth of a germanium-containing material. Moreover, the resist mask 106 may expose the mask layer 105 formed above the transistor 130 so as to expose the layer 105 to an appropriately designed anisotropic etch process for removing material of the layer 105 from horizontal device portions. Thus, during the etch process, the semiconductor layer 103 may be exposed in the device region 120 and in the transistor 130, while sidewalls may remain covered, thereby forming the spacer structure 105A. Moreover, the top surface of the gate electrode 131 may remain covered by the previously provided cap layer 133.

Thereafter, a further selective etch ambient 107 may be established that is designed for selectively removing material of the semiconductor layer 103 with respect to the resist mask 106 and the spacer structure 105A and the cap layer 133. For this purpose, well-established chemistries and etch techniques may be used. During the etch process 107, a recess 103R may be created in the diode region 120, while cavities 103A may be generated next to the gate electrode 131, wherein a lateral offset of the cavities 103A with respect to the gate electrode 131 may be substantially determined by the width of the spacer structure 105A and the characteristics of the etch process 107. Furthermore, the etch process 107 may be controlled such that a desired depth of the cavities 103A and also of the recess 103R is obtained. Next, the resist mask 106 may be removed by using well-established plasma-assisted or wet chemical resist removal techniques, depending on the overall process requirements.

FIG. 1b schematically illustrates the semiconductor device 100 in an advanced manufacturing stage. As illustrated, the device 100 is subjected to a selective epitaxial growth process 108 during which the cavities 103A and the recess 103R may be commonly filled with a silicon/germanium alloy material 109. Since the silicon/germanium material 109 may be provided for enhancing performance of the transistor 130, the germanium concentration may be selected in view of a gain in performance of the transistor 130 so that a germanium concentration of the material 109 may be approximately 15 atomic percent more, for instance 20-30 atomic percent or higher, as long as a desired crystalline configuration may be achieved during the process 108. During the selective epitaxial growth process 108, the exposed material of the layer 103 may act as a crystalline template material, thereby resulting in a crystalline growth of the material 109 with a lattice constant that substantially corresponds to the lattice constant of the template material. Consequently, the material 109 may be provided in a moderately high strained state, depending on the germanium concentration in the material 109, since the natural lattice constant of a silicon/germanium alloy is greater than the lattice constant of a substantially pure silicon material. For this reason, the material 109 in the transistor 130 may result in a respective compressive strain component in a channel region 134 of the transistor 130, thereby enhancing the charge carrier mobility therein. On the other hand, the strained material 109 in the region 120 may have increased temperature sensitivity due to the reduced band gap energy of the silicon/germanium compound, thereby providing an increased temperature dependence of a diode current of a diode structure still to be formed in the region 120. That is, due to the reduced band gap energy for a given temperature, an increased amount of charge carriers may transit into the conductor band compared to a silicon material. Consequently, the diode characteristic of a diode structure formed on the basis of the material 109 may have an increased temperature sensitivity compared to conventional silicon-based diode structures.

It should be appreciated that the germanium-containing material 109 may be formed separately in the region 120 on the basis of appropriate process techniques, such as implantation, selective epitaxial growth techniques as shown in FIG. 1b and the like, while the transistors 130, 140 may be masked so as to not unduly affect the transistors 130, 140 if the presence of germanium material therein may be considered inappropriate or if different types of germanium-containing materials are to be provided in the transistor 130 and the region 120.

FIG. 1c schematically illustrates the semiconductor device 100 in an advanced manufacturing stage. As illustrated, the transistor 130 may be comprised of drain and source regions 135, a portion of which may be represented by the silicon/germanium alloy 109. In the embodiment shown, the drain and source regions 135 represent P-doped regions having a moderately high dopant concentration of any appropriate P-type dopant species. Similarly, a heavily doped region 125 may be defined in the region 120, wherein, in the embodiment shown, the doped region 125 may represent a P-doped region having a similar vertical dopant profile as the drain and source regions 135 of the transistor 130. For example, when the drain and source regions 135 may extend beyond the depth of the silicon/germanium material 109, the doped region 125 may have a portion 125A corresponding to a P-doped silicon/germanium material and a portion 125B corresponding to a P-doped silicon-based region. In other illustrative embodiments, a vertical extension of the dopant species in the region 125 may be substantially restricted to the material 109, while, in other cases, the respective dopant species may be provided substantially completely within the material 109. It should be appreciated that the vertical extension of the drain and source regions 135 may substantially correspond to the dopant distribution in the region 125, when identical implantation conditions may have been used for the device region 120 and the transistor 130. In other illustrative embodiments, if an individual variation of the penetration depth may be required, a screening layer may be provided in the region 120, thereby reducing the penetration depth for a given set of implantation parameters, and/or a masking scheme may be used in combination with different implantation parameters so as to individually adjust the depth of the regions 135 and 125.

Moreover, a resist mask 110 may be formed above the device 100 such that the transistor 140 and an area 126 of the region 120 may be exposed to an implantation process 111 for introducing a dopant species of inverse conductivity type compared to the region 125. In the embodiment shown, an N-type dopant species may be incorporated on the basis of appropriately selected process parameters, thereby also forming drain and source regions 145 in the transistor 140. As previously explained with reference to the P-doped region 125, also in this case, the N-doped region 126 may have a doped region 126A within the silicon/germanium material 109, in combination with a region 126B in the silicon material of the layer 103. Thus, the regions 125 and 126 may form a PN junction 120p, wherein at least a portion thereof may be formed within the silicon/germanium material 109, while also a portion thereof may be represented by the P-doped region 125 in combination with the surrounding N-doped well region. After the implantation process 111, the resist mask 110 may be removed and appropriate anneal processes may be performed to activate the dopant species and recrystallize implantation-induced damage.

Figure 1D:
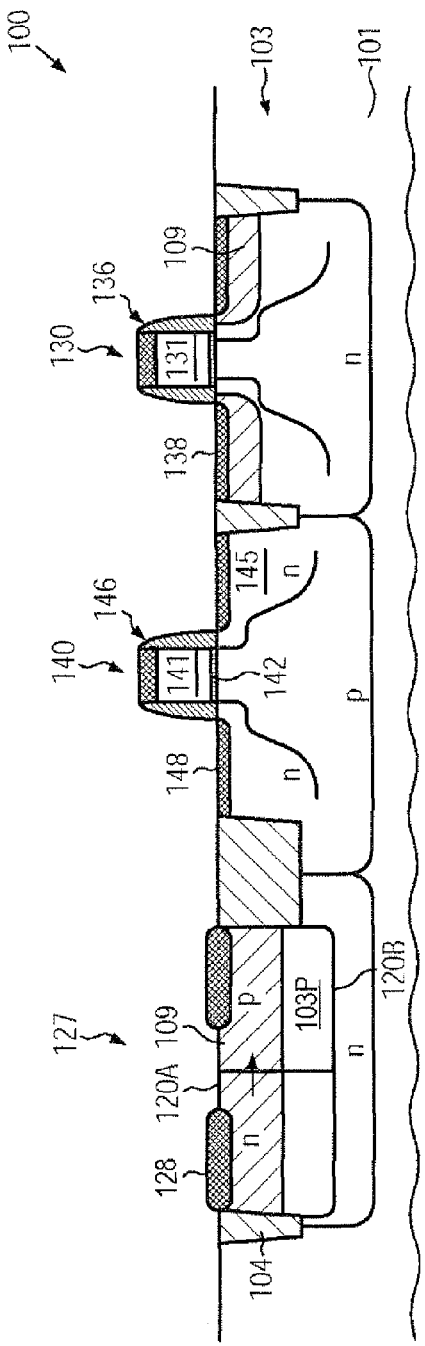
FIG. 1d schematically illustrates the semiconductor device during an advanced manufacturing stage with an SOI configuration with a diode structure including germanium material, according to further illustrative embodiments.

FIG. 1d schematically illustrates the device 100 in a further advanced manufacturing stage. As shown, the transistors 130 and 140 may comprise respective metal silicide regions 138, 148 so as to reduce contact resistivity. Similarly, a thermal sensing diode structure 127 comprised of the P-doped region 125 and the N-doped region 126 may be formed in the diode region 120 and may comprise metal silicide regions 128 so as to also reduce contact resistance for the diode structure 127. In the embodiment shown, the diode structure 127 may have a direct PN junction within the silicon/germanium material 109, which may require one or more process steps prior to or after the formation of the metal silicide regions 138, 148 and 128. For instance, the metal silicide regions 138, 148 may be formed on the basis of a self-aligned technique, where the silicide formation may be substantially suppressed by the spacer structures 136, 146, while a respective silicide blocking layer may not be present above the material 109 in the region 120. Thus, in this case, an appropriate blocking layer portion, such as silicon dioxide, silicon nitride and the like, may be formed above the material 109 in the diode structure 127 in order to avoid a direct contact between the P-doped region 125 and the N-doped region 126. This may be accomplished by depositing an appropriate material and patterning the same by means of lithography. In other cases, the metal silicide in the diode structure 127 may be formed first and may be patterned by masking the transistors 130, 140. Consequently, the semiconductor device 100 may comprise the diode structure 127 used for thermal sensing applications, wherein the silicon/germanium material 109 may provide enhanced temperature sensitivity, while also reduced area may be required for obtaining an appropriate temperature-dependent signal from the diode structure 127. In the embodiment shown, at least the interface between doped regions 125A and 126A may represent a PN junction area including the silicon/germanium material, thereby providing increased temperature sensitivity. On the other hand, the portion 120B of the overall PN junction may represent a substantially "standard" silicon PN junction wherein, however, nevertheless, an enhanced temperature sensitivity may be achieved. In other cases, as previously discussed, the penetration depth of at least the dopant species in the doped region 125 may be selected such that the portion 120B may also be within the silicon/germanium material 109, thereby providing further increased temperature sensitivity.

It should be appreciated that the conductivity type of the dopant species shown in the diode structure 127 may be inverted with respect to the well region 103P, depending on the device requirements.

Figure 1E:
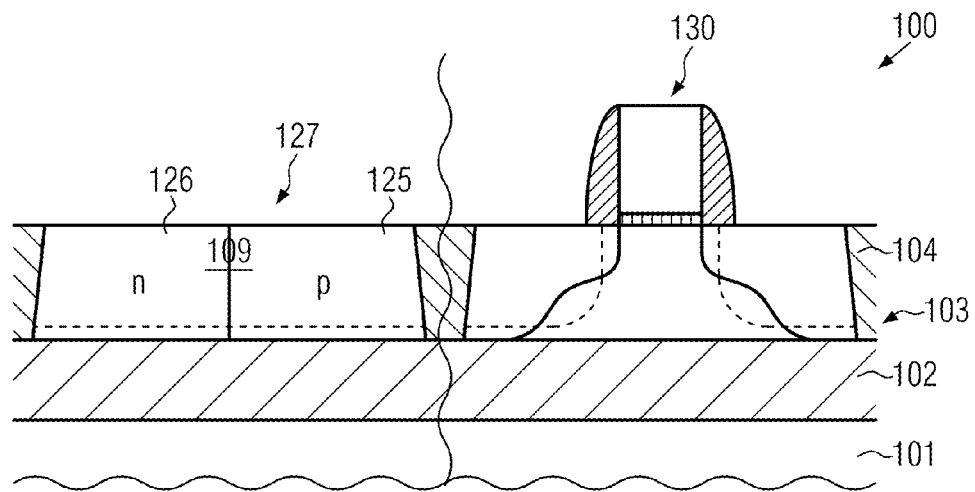
FIG. 1e schematically illustrates the semiconductor device with an SOI configuration with a diode structure including germanium material, according to still further illustrative embodiments.

FIG. 1e schematically illustrates the semiconductor device 100 according to other embodiments with a buried insulating layer 102, for instance a silicon dioxide layer and the like, which may be positioned between the silicon-containing semiconductor layer 103 and the substrate 101, thereby defining an SOI configuration. In the embodiment shown, the dopant profile of the transistor 130 may extend down to the buried insulating layer 102 and also the P-dopant species and the N-dopant species in the regions 125 and 126 of the thermal sensing diode structure 127 may extend to the buried insulating layer 102. In this case, the PN junction 120B may include the portion 120A which may be significantly longer compared to the portion 120B so that the major part of the PN junction 120B, that is, the portion 120A, may be formed by a silicon/germanium material, thereby providing the desired enhanced temperature sensitivity. With respect to any manufacturing techniques for forming the device 100 in the form of an SOI device, well-established process techniques may be used, thereby also achieving a high degree of compatibility with conventional strategies.

Figure 1F:
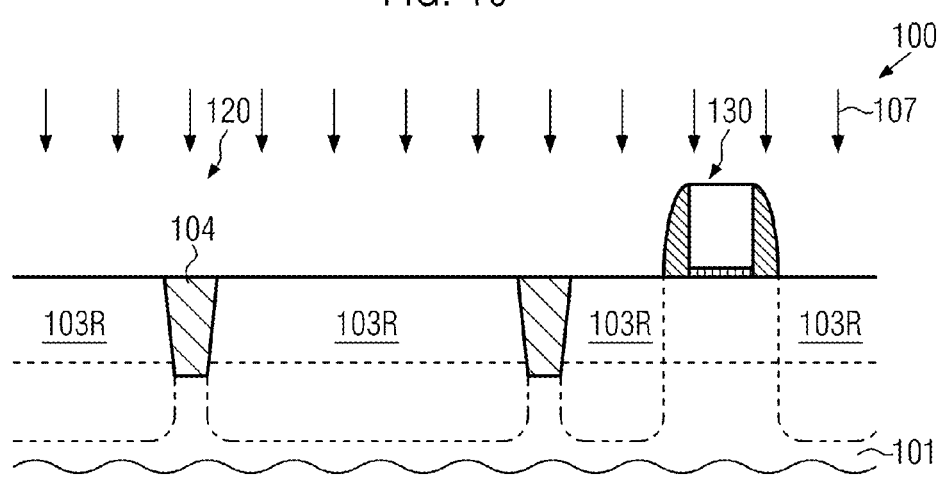
FIGS. 1f-1g schematically illustrate cross-sectional views of a semiconductor device during various manufacturing stages in forming a diode structure containing a silicon/germanium alloy, wherein an N-doped region and a P-doped region are separated by an isolation structure, according to illustrative embodiments.
Figure 1G:
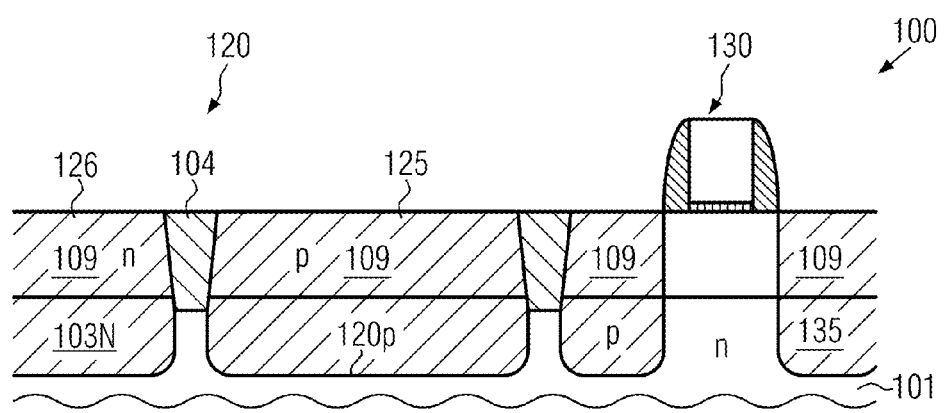

With reference to FIGS. 1f and 1g, further illustrative embodiments will be described in which a direct contact of the P-doped silicon/germanium region and the N-doped silicon/germanium region may be avoided by using an isolation structure, thereby avoiding self-aligned behavior during the formation of metal silicide regions.

FIG. 1f schematically illustrates the device 100 during the etch process 107 for forming the cavities 103A in the transistor 130. Similarly, in the device region 120, the recesses 103R may be formed, wherein an isolation structure 104 may be provided to separate the recesses 103R. Hence the P-doped region and the N-doped region in the region 120 may be formed in individual recesses 103R which are separated by the isolation structure 104. With respect to any process parameters or strategies for the etch process 107, the same criteria apply as previously explained.

FIG. 1g schematically illustrates the semiconductor device 100 in a further advanced manufacturing stage. As shown, the silicon/germanium material 109 is formed in the transistor 130 and also in the region 120. Furthermore, the drain and source regions 135 are formed in the transistor 130, while also the P-doped region 125 may be formed in one portion of the material 109, while the N-doped region 126 may be formed in the other portion separated by the isolation structure 104. In one illustrative embodiment, the material 109 may be formed by the epitaxial growth technique as previously described, wherein, additionally, silicon/germanium material 109 may be provided in the form of a P-doped material, thereby defining the PN junction 120P with the P-well 103P. In this case, the N-doped region 126 may be formed by appropriately counter-doping the material 109 down to a depth that substantially corresponds to the depths of the recesses 103R, thereby avoiding a PN junction in the region 126 with the P-well 103P. Consequently, also in this case, enhanced temperature sensitivity may be achieved on the basis of a well-defined gradient at the PN junction 120P since the dopant concentration may be determined by the selective epitaxial growth process.

Figure 1H:
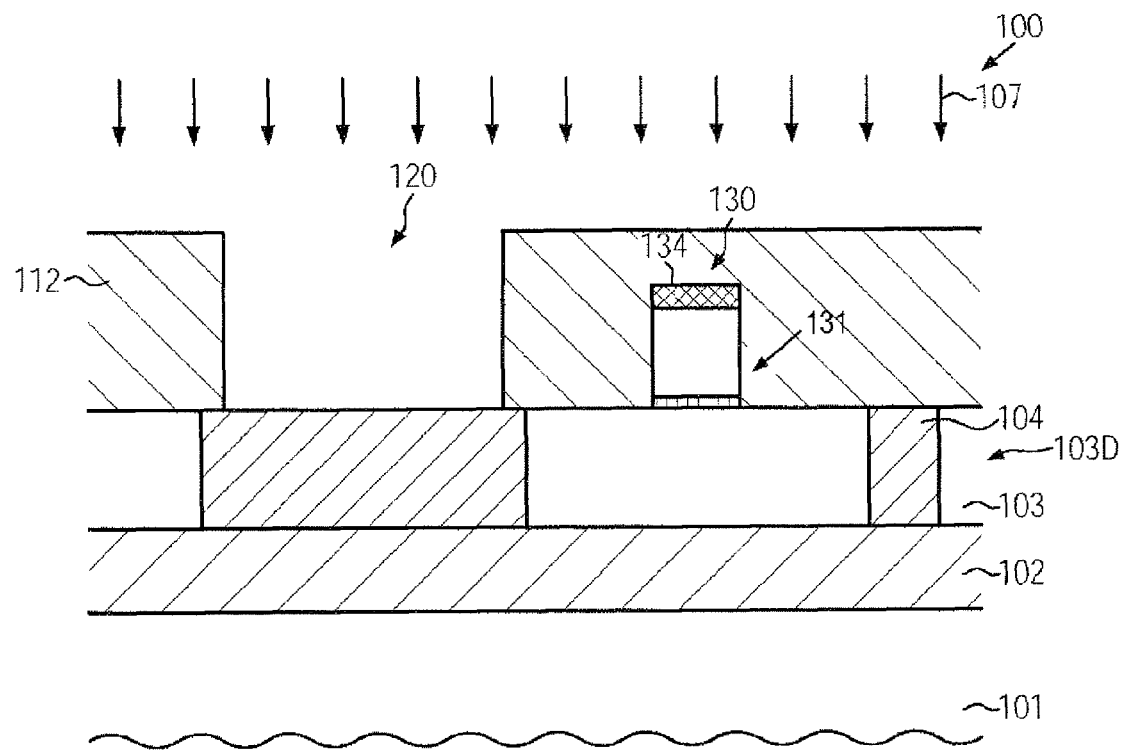
FIGS. 1h-1i schematically illustrate cross-sectional views of a semiconductor device in an SOI configuration during various manufacturing stages in forming a thermal sensing diode in the crystalline substrate material of the device, according to further illustrative embodiments.
Figure 1I:
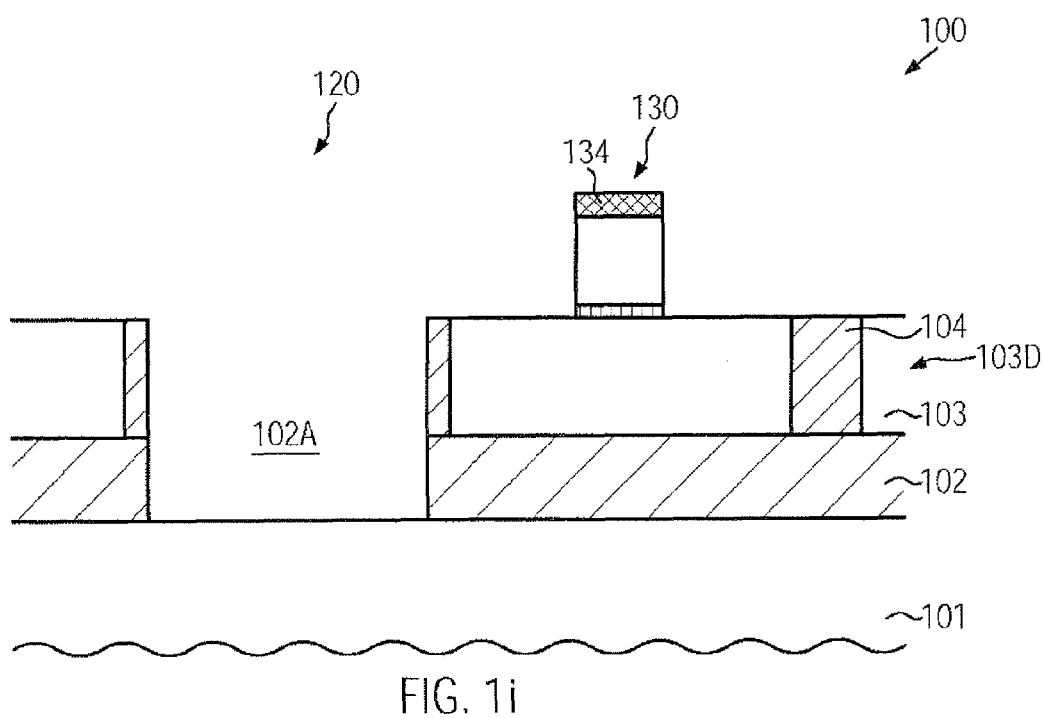
Figure 1J:
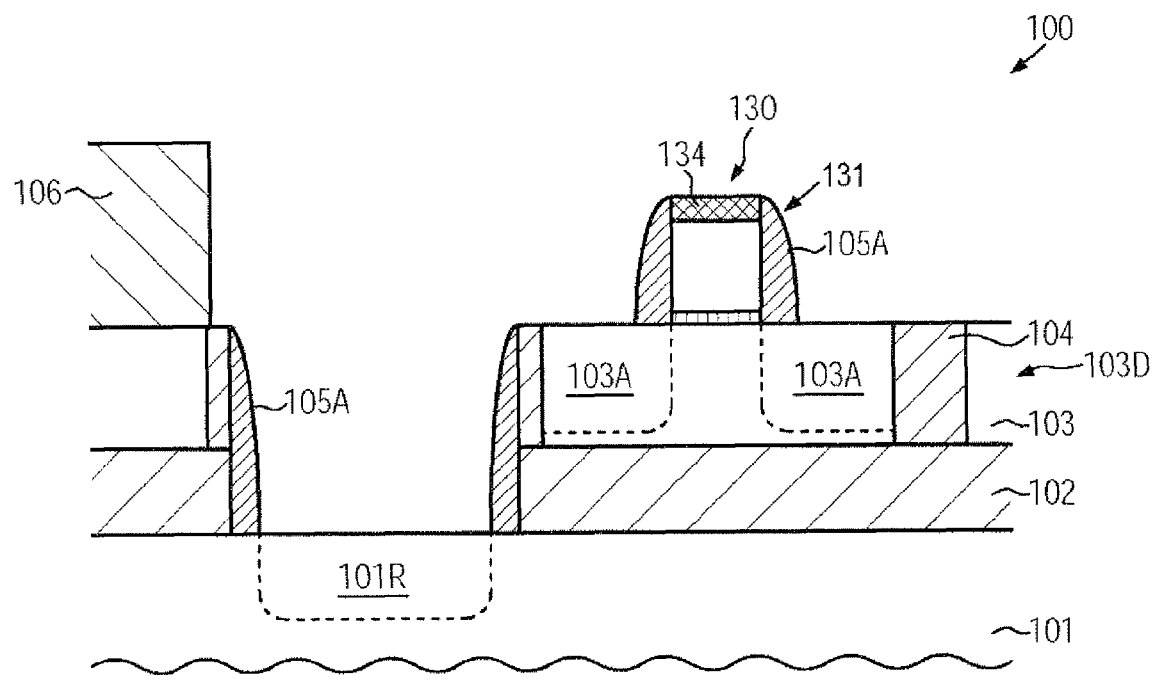
FIG. 1j schematically illustrates the semiconductor device according to an SOI configuration, wherein a P-doped region and an N-doped region are formed on the basis of a silicon/germanium alloy without a direct PN junction, according to still further illustrative embodiments.

With reference to FIGS. 1h-1j, further illustrative embodiments will now be described in which the device 100 represents an SOI configuration, wherein the diode structure 127 may be formed in the substrate 101.

FIG. 1h schematically illustrates the device 100 with the buried insulating layer 102 on which may be formed the layer 103 in combination with the respective isolation structures 104. For convenience, the combination of the silicon-containing layer 103 and the isolation structures 104 may be referred to as device layer 103D. In the embodiment shown, the region 120 may be positioned above an appropriately sized isolation structure 104, while the transistor 130 may be formed above a respective transistor active region, as previously explained. Furthermore, in the manufacturing stage shown, an etch mask 112 may be provided with an opening to expose a portion of the isolation structure 104 in the region 120. Furthermore, the mask 112 may cover the transistor 130, which, in the manufacturing stage shown, may comprise the gate electrode 131 including a cap layer 134. The etch mask 112 may be formed on the basis of well-established lithography techniques. Thereafter, an anisotropic etch process may be performed to etch through the device layer 103D and the buried insulating layer 102.

FIG. 1i schematically illustrates the semiconductor device 100 after the above-described etch process and the removal of the etch mask 112. Hence, an opening 102A is formed in the device region 120, thereby exposing the substrate 101 so as to form therein the diode structure 127 including a germanium material for enhancing the temperature sensitivity. For this purpose, substantially the same process strategy may be applied as previously explained with reference to FIGS. 1a-1d. That is, if required, cavities may be formed for the transistor 130 and may also be formed in the exposed portion of the substrate 101 so as to prepare the device 100 for the epitaxial growth of the silicon/germanium material. In other illustrative embodiments (not shown), the transistor 130 may be covered by an appropriate mask layer, such as the mask layer 105 in FIG. 1a provided for the transistor 140, so as to essentially avoid any deposition of silicon/germanium material if a respective material is not desired in the transistor 130. In this case, the silicon/germanium material may be selectively grown within the opening 102A up to any desired height level and thereafter the diode structure may be formed in accordance with process techniques as previously described.

FIG. 1j schematically illustrates the semiconductor device 100 in an advanced manufacturing stage wherein, in the embodiment shown, a recess 101R may be formed during the etch process 107 (FIG. 1h) together with the cavities 103A. In this case, the resist mask 106 may cover, in combination with a mask layer, such as the mask layer 105 (FIG. 1a), other device areas in which a recess and an epitaxial growth of silicon/germanium material may not be desired. Hence, the gate electrode 131 of the transistor 130 may be encapsulated by the cap layer 134 and the spacer structure 105A, wherein a corresponding spacer structure 105A may also be formed on sidewalls of the opening 102A. Thus, after the end of the etch process 107, the resist mask 106 may be removed and the selective epitaxial growth process 108 (FIG. 1b) may be performed to re-fill the cavities 103A and the recess 101R with the silicon/germanium material. Thereafter, the further processing may be continued by defining drain and source regions in the transistor 130, thereby also creating a P-doped region in the re-filled recess 101R. Furthermore, upon forming the drain and source regions of N-type transistors, a corresponding N-doped region may be formed in direct contact with the P-doped region, thereby defining at least a portion of a PN junction including the silicon/germanium material having the increased temperature sensitivity, as previously explained.

Thus, a highly temperature-sensitive diode structure may be implemented in the substrate 101 without adding additional process complexity compared to conventional strategies for substrate diodes on the basis of a silicon material.

Figure 2:
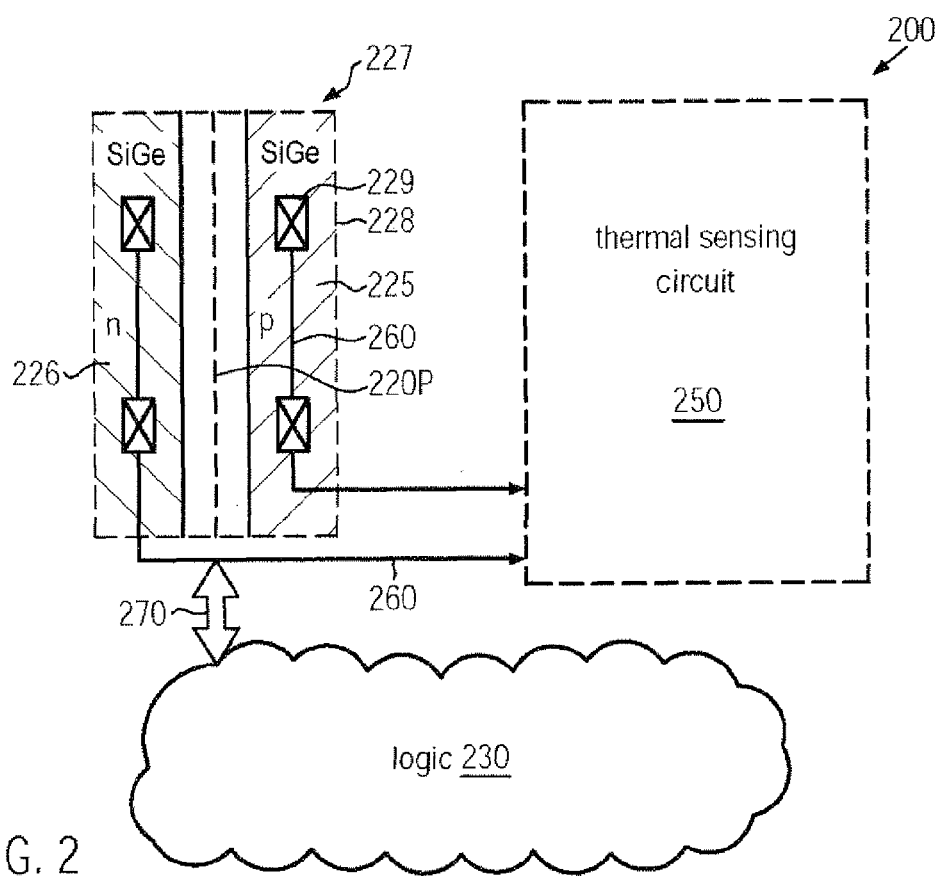
FIG. 2 schematically illustrates a semiconductor device including a silicon/germanium-based thermal sensing diode structure connected to a thermal support circuit, according to still further illustrative embodiments.

FIG. 2 schematically illustrates a semiconductor device 200 in a schematic top view according to further illustrative embodiments. As shown, the semiconductor device 200 may comprise a device region 230 which may represent any portion of an integrated circuit including a plurality of transistor elements, the operation of which may result in a more or less pronounced generation of heat, as previously explained. For example, fast switching transistor elements of a speed-critical circuit portion may be provided within the device region 230, thereby creating enhanced thermal losses which may result in a corresponding local heating of the semiconductor device 200. Furthermore, the device 200 may comprise a temperature sensing diode structure 227, which may comprise germanium material, at least in some areas of a respective PN junction, to obtain an increased temperature sensitivity compared to silicon diodes, as previously described. Thus, the thermal sensing diode 227 may comprise a P-doped region 225 comprising germanium, for instance in the form of a silicon/germanium alloy material, as previously explained, and may also comprise an N-doped region 226 which may also comprise germanium, for instance in the form of a silicon/germanium material. At least one of the regions 225, 226 may create a PN junction, wherein, in some illustrative embodiments, the regions 225 and 226 may be in direct contact so as to define a respective PN junction 220P, while also a remaining portion of the region 225 or 226 may additionally define a PN junction with a silicon-based material that is in contact with the diode structure 227. It should be appreciated that the diode structure 227 may have any appropriate configuration, for instance the diode structure 227 may be formed in the device layer in which respective transistor elements may also be formed, as previously explained, while, in other cases, the diode structure 227 may be located in the substrate of an SOI configuration, as also previously described. Furthermore, the diode structure 227 may comprise a contact area of enhanced conductivity 228, for instance in the form of a metal silicide when the corresponding germanium concentration may allow the formation of a metal silicide, while, in other cases, an appropriate silicon concentration may be provided at least at the contact area 228 so as to enable the formation of a metal silicide, if required. As previously discussed, respective masking schemes may be applied when the regions 225 and 226 may be in direct contact so as to provide a defined separation of contact areas connected to the region 225 and contact areas connected to the region 226. Furthermore, respective contact elements 225 may be provided to connect to the regions 228 and to an overlying metallization system (not shown), which may establish the required electrical connections within the semiconductor device 200.

It should be appreciated that FIG. 2 is a highly schematic view wherein, for instance, respective connections of the wiring level of the device 200 may be represented by simple lines 260, which may therefore represent the entirety of circuit elements in the wiring level required for appropriately interconnecting the individual elements of the device 200 so as to exchange signals between the structure 227 and the circuit 250. For example, the contact elements 229 corresponding to the P-doped region 225 may be connected and also the respective contact elements 229 corresponding to the N-doped region 226 may be connected. Furthermore, the diode structure 227 may be connected to a thermal sensing circuit 250, which may comprise any appropriate circuit elements, such as transistors and the like, for receiving a temperature sensitive signal and to provide an appropriate output signal that may be used for estimating and/or controlling thermal conditions in the device 200. For example, the thermal sensing circuit 250 may provide an appropriate voltage to the thermal sensing diode 227, wherein a resulting current may be dependent on the thermal conditions within the diode structure 227. Hence, the magnitude of the current detected by the thermal sensing circuit 250 may give an indication of the temperature conditions of the diode 227 and thus of the device region 230, which may thermally be coupled to the diode 227, as indicated by 270. Due to the increased thermal sensitivity of the diode 227 including the germanium material, the overall size thereof may be reduced compared to silicon-based diode structures, which may enable an increased coverage of respective device regions 230 across the entire device 200 or increased packing density may be achieved in the device regions 230 for a desired degree of coverage with respect to the thermal monitoring of the device 200.

As a result, the present disclosure provides semiconductor devices and methods wherein enhanced temperature control efficiency may be achieved by using a germanium material in a thermal sensing diode structure, which may result in reduced area consumption for the diode structure through the increased temperature sensitivity of the germanium-based PN junctions. Consequently, the local temperature across sophisticated semiconductor devices may be detected with enhanced reliability and, if desired, with enhanced coverage, thereby also enhancing the efficiency of die-internal temperature monitoring and control systems, which may finally result in overall enhanced device reliability. Furthermore, since a certain degree of temperature control reliability may be obtained by consuming less die area, packing density of semiconductor devices may be increased. The germanium material may be incorporated into the thermal sensing diode structure on the basis of well-established process techniques wherein, in some illustrative embodiments, a high degree of compatibility with sophisticated manufacturing strategies may be achieved in which silicon/germanium alloy material may be used for enhanced transistor performance. In some illustrative embodiments, the germanium material may be incorporated into the thermal sensing diode structures without additional process steps compared to conventional silicon-based techniques, when concurrently providing the silicon/germanium material in transistor elements such as P-channel transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
a silicon-containing semiconductor layer;

a thermal sensing diode formed in said silicon-containing semiconductor layer, said thermal sensing diode comprising a P-doped region and an N-doped region, at least one of said P-doped region and said N-doped region comprising a first silicon/germanium alloy material;
a transistor formed in and above said silicon-containing semiconductor layer, wherein said transistor comprises a gate electrode and drain and source regions, a portion of said drain and source regions is comprised of a second silicon/germanium alloy material, and said first and second silicon/germanium alloy materials have substantially the same germanium concentration;
a first contact element coupled to said P-doped region;
a second contact element coupled to said N-doped region; and
a thermal sensing circuit coupled to the first and second contact elements.

2. The semiconductor device of claim 1, further comprising a further transistor having drain and source regions formed in said silicon-containing semiconductor layer, wherein an amount of germanium of the drain and source regions of said further transistor is less than an amount of germanium of said transistor.

3. The semiconductor device of claim 2, wherein said transistor is a P-channel transistor and said further transistor is an N-channel transistor.

4. The semiconductor device of claim 1, further comprising a buried insulating layer located below said silicon-containing semiconductor layer.

5. The semiconductor device of claim 1, wherein said first silicon/germanium alloy material is provided in a strained state.

6. The semiconductor device of claim 1, wherein said silicon-containing semiconductor layer comprises:
a first silicon-containing layer;
a second silicon-containing layer formed above said first silicon-containing layer; and
a buried insulating layer disposed between the first and second silicon containing layers, wherein the thermal sensing diode is formed in the first silicon-containing layer, and the transistor is formed in and above the second silicon-containing layer.

* * * * *